US 6,689,681 B2

(12) United States Patent
Watanabe

(10) Patent No.: US 6,689,681 B2
(45) Date of Patent: Feb. 10, 2004

(54) SEMICONDUCTOR DEVICE AND A METHOD OF MANUFACTURING THE SAME

(75) Inventor: Kenichi Watanabe, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/242,623

(22) Filed: Sep. 13, 2002

(65) Prior Publication Data

US 2003/0015802 A1 Jan. 23, 2003

Related U.S. Application Data

(62) Division of application No. 09/955,336, filed on Sep. 19, 2001, now Pat. No. 6,492,734.

(30) Foreign Application Priority Data

Apr. 13, 2001 (JP) ........................................ 2001-115501

(51) Int. Cl.$^7$ .......................................... H01L 21/4763
(52) U.S. Cl. ....................... 438/633; 438/638; 438/975; 257/E21.577; 257/E21.579
(58) Field of Search ........................ 438/587, 622–633, 438/637–638, 618, 975, FOR 435; 257/E21.577, E21.579, E23.152

(56) References Cited

U.S. PATENT DOCUMENTS 6,333,519 B1    12/2001   Nakazawa
6,340,632 B1    1/2002    Fukada et al.

FOREIGN PATENT DOCUMENTS

| JP | 5-267336    | 10/1993 |
| JP | 11-330381   | 11/1999 |
| JP | 2000-306822 | 11/2000 |

Primary Examiner—George Fourson
Assistant Examiner—Thanh V Pham
(74) Attorney, Agent, or Firm—Westerman, Hattori, Daniels & Adrian, LLP

(57) ABSTRACT

A semiconductor device includes a first insulating layer which is formed above a semiconductor substrate including a plurality of semiconductor elements and which includes lower-layer damascene wiring, a second insulating layer which is formed on the first insulating layer and which includes a second damascene wiring and an aligning wiring pattern forming a first step, and a first aligning surface wiring pattern including a surface wiring pattern to cover the second damascene wiring and a first aligning surface wiring pattern which is formed on the aligning wiring pattern and which has a second step reflecting the first step. The surface wiring pattern and the first aligning surface wiring pattern are formed using one surface wiring layer. A novel multi-layer wiring structure thus obtained is suitably manufactured by the damascene process.

6 Claims, 8 Drawing Sheets t : WIRING LAYER THICKNESS
D : GROOVE DEPTH
T-D : DISTANCE BETWEEN STEP IN GROOVE AND INSULATION LAYER SURFACE

SEMICONDUCTOR DEVICE AND A METHOD OF MANUFACTURING THE SAME

This application is a Division of prior application Ser. No. 09/955,336 filed Sep. 19, 2001 U.S. Pat. No. 6,492,734.

This application is based on Japanese Patent Application 2001-115501, filed on April 13, all the content of which is incorporated in this application by reference.

BACKGROUND OF THE INVENTION

1. Field of the Invention

The present invention relates to a semiconductor device and a method of manufacturing the same, and in particular, to a semiconductor device including damascene wiring and a manufacturing method thereof.

2. Description of the Related Art

As the integration degree increases in the manufacturing of semiconductor devices, the respective values stipulated by the design rule become smaller. A technical limit is approaching in a semiconductor fabricating method in which a surface metallic wiring layer of aluminum, wolfram, or the like is formed on a surface of an insulating layer, a resist pattern is formed on the surface metallic wiring layer, and then the surface metallic wiring layer is directly etched.

Semiconductor manufacturers have started adopting a damascene process in place of the method in which the surface wiring layer is patterned by etching. In the damascene process, an inter-layer insulating layer is beforehand formed, wiring grooves and via holes are disposed in the inter-layer insulating layer by etching, and a wiring material is filled in the wiring grooves and the via holes. The damascene process is a suitable method to form narrow wiring in a silicon oxide layer or film.

As a material for the wiring or the wiring layer, aluminum has been mainly used in the prior art. However, aluminum has a technical limit for the following reasons. Aluminum has high resistance, and electro-migration easily occurs in a layer made of aluminum. Therefore, copper is increasingly used because copper has relatively lower resistance and electro-migration occurs less frequently in a layer of copper. Although patterning of copper by etching is attended with difficulty, copper wiring can be formed by the damascene process.

The copper wiring is harder than the aluminum wiring and highly corrosive. For example, when the aluminum wiring is left standing in an atmospheric environment, aluminum oxide $Al_2O_3$ is formed on a surface of the aluminum wiring and hence automatically stops the corrosion thereof. On the other hand, when the copper wiring is left standing in an atmospheric environment, oxide of copper $CuOx$ is formed on a surface of the copper wiring. However, the copper oxide film cannot fully stop the corrosion thereof, namely, the copper wiring is corrosive.

Additionally, the copper wiring is hard. This makes it difficult to achieve the bonding process of the prior art. Consequently, there are employed, for example, a bump forming process and a process to form an aluminum pad for wire bonding. These processes increase the number of processing steps. Therefore, the production cost is soared, the defect density is increased, and yield is lowered in the semiconductor manufacturing.

Although the damascene process has already been used as a wiring process, this process is attended with an inherent problem.

SUMMARY OF THE INVENTION

It is therefore an object of the present invention to provide a semiconductor device including novel multilayer wiring structure which can be suitably formed by the damascene process.

Another object of the present invention is to provide a method of manufacturing a semiconductor device including novel multilayer wiring structure which can be suitably formed by the damascene process.

According to one aspect of the present invention, there is provided a semiconductor device comprising a semiconductor substrate including a plurality of semiconductor elements, a second insulating layer formed on said semiconductor substrate, a damascene wiring depression formed in a surface of said second insulating layer beginning at the surface, said depression having a first width; an aligning groove formed in said surface of said second insulating layer beginning at the surface, said aligning groove having a second width larger than said first width; a damascene wiring formed by filling a substance in said damascene wiring depression, an aligning wiring pattern formed in a wiring layer of said damascene wiring in said aligning groove, said aligning wiring pattern forming a first step; a surface wiring pattern formed on a surface of said second insulating layer, said surface wiring pattern being connected to said damascene wiring; and a first aligning surface wiring pattern formed of a wiring layer which also forms said surface wiring pattern on said aligning wiring pattern, said first aligning surface wiring pattern having a second step reflecting said first step.

According to one aspect of the present invention, there is provided a semiconductor device manufacturing method, comprising the steps of (a) forming a second insulating layer above an underlay including a semiconductor substrate including a plurality of semiconductor elements, (b) forming a wiring groove having a first width in a surface of said second insulating layer beginning at said surface and an aligning groove having a second width larger than said first width, (c) forming second damascene wiring embedded in said wiring groove, said second damascene wiring having substantially a flat surface and forming a wiring pattern in said aligning groove, said wiring pattern having a first step; (d) forming a surface wiring layer on said second insulating layer, said surface wiring layer forming a second step reflecting the first step on said aligning groove; (e) forming a resist layer on said surface wiring layer, exposing and developing said resist layer using the second step as an aligning marker, and resultantly forming a resist pattern; and (f) etching said surface wiring layer using said resist pattern as an etching mask and resultantly forming a surface wiring pattern connected to said wiring pattern.

The process to form a surface wiring pattern on the damascene wiring can be conducted using only one mask.

According to the present invention described above, it is possible to fabricate a semiconductor device including multilayer damascene wiring and surface wiring through a relatively small number of process steps.

On the damascene wiring, a bonding pad, a fuse, or the like can be formed using an aluminum layer. The wiring pattern can also be formed at the same time.

BRIEF DESCRIPTION OF THE DRAWINGS

The objects and features of the present invention will become more apparent from the consideration of the following detailed description taken in conjunction with the accompanying drawings in which.

DESCRIPTION OF THE EMBODIMENTS

Referring now to the accompanying drawings, description will be given of an embodiment.

FIGS. 1(A) to 1(K) show cross-sectional views and plan views of a semiconductor substrate for explaining primary processes of manufacturing a semiconductor device in an embodiment.

Figure 1A:
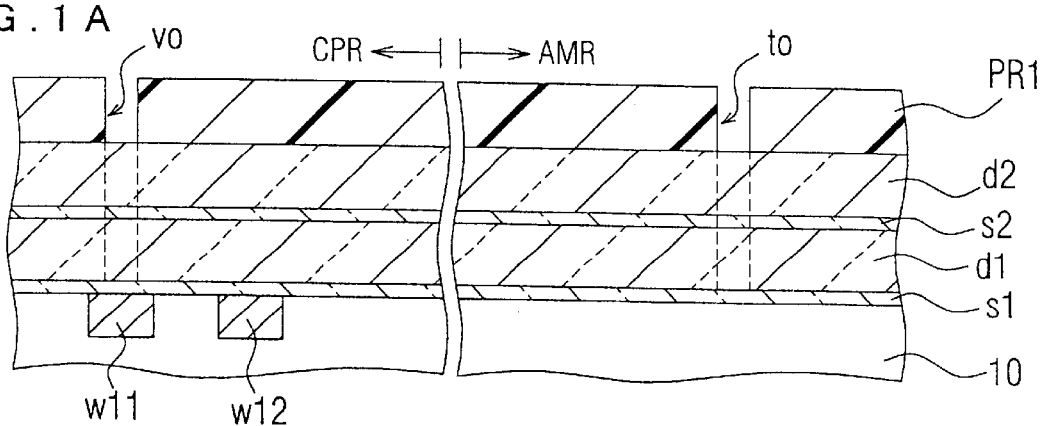
FIGS. 1(A) to 1(K) are cross-sectional views and plan views of a semiconductor substrate schematically showing processes of manufacturing a semiconductor device in an embodiment of the present invention.

As shown in FIG. 1(A), on an underlay 10 including a plurality of semiconductor devices and part of wiring, there are formed, a lower etching stopper layer s1 of, for example, an about 50 nanometer (nm) thick layer of silicon nitride (SiN), a lower first interlayer insulating layer d1 of, for example, an about 500 nm thick layer of silicon oxide, an upper etching stopper layer s2 of, for example, an about 50 nanometer thick SiN layer, and an upper interlayer insulating layer d2 of, for example, an about 1100 nm thick silicon oxide layer. In FIG. 1(A), a circuit pattern region CPR and an aligning mark area AMR are shown in the left-half and right-half sides, respectively. In the circuit pattern region CPR, the underlay 10 is configured, for example, as shown in FIG. 3.

Figure 3:
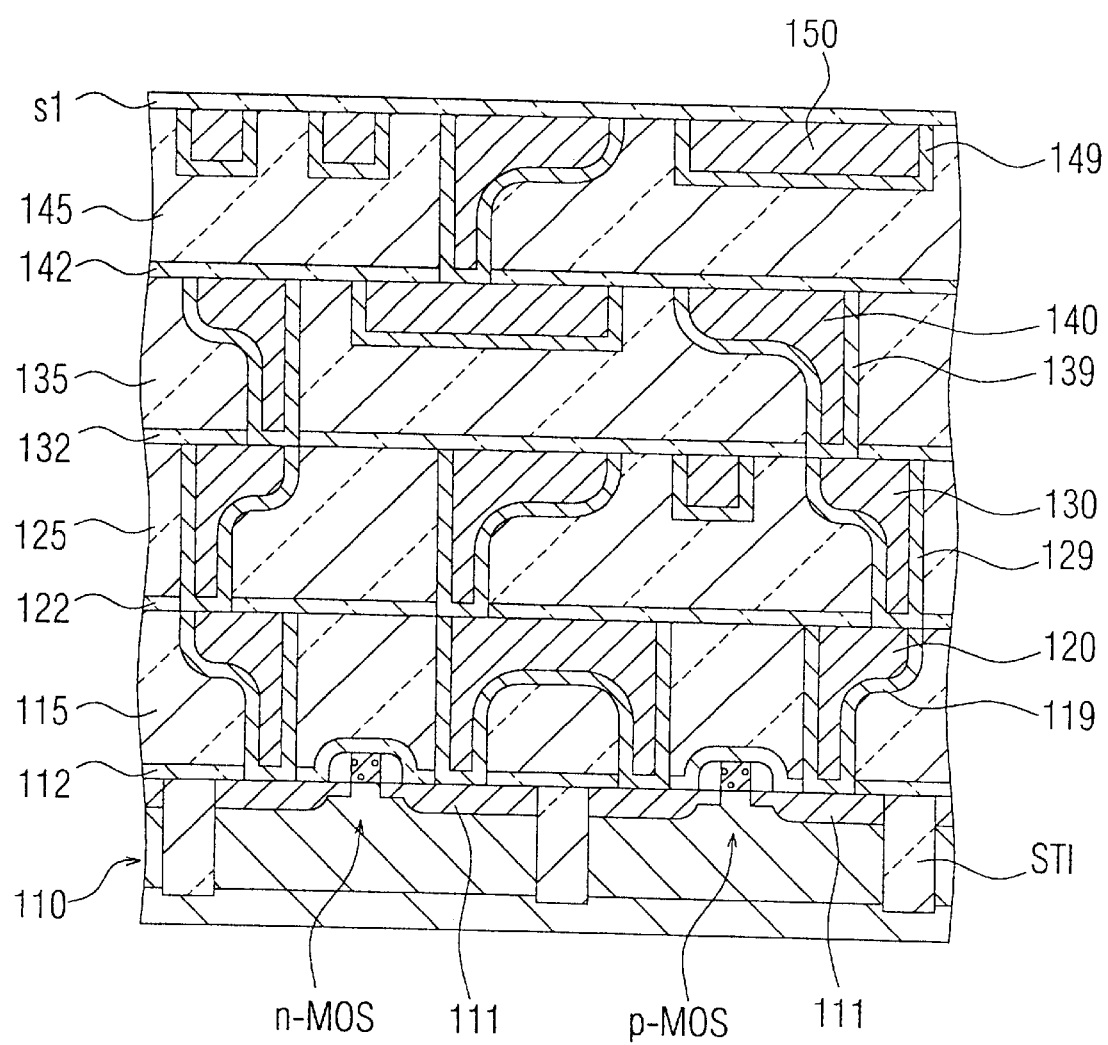
FIG. 3 is a cross-sectional view schematically showing multi-layer wiring structure of a semiconductor device in an embodiment of the present invention.

FIG. 3 shows an example of constitution of an integrated semiconductor circuit device excepting an upper-most wiring layer in a cross-sectional view. On a surface of a silicon substrate 110, a device isolation layer STI is formed by shallow trench isolation to resultantly define an active region. In the constitution of FIG. 3, an n-channel metal-oxide semiconductor (MOS) transistor (n-MOS) is formed in one active region and a p-channel MOS transistor (p-MOS) is formed in another active region.

Each of the n-MOS and p-MOS transistors includes an insulated gate electrode configuration on a surface of the substrate. On both sides of each gate electrode of the n-MOS transistor, an n-type source and drain region 111 is formed in the substrate. On both sides of each gate electrode of the p-MOS transistor, a p-type source and drain region 111 is formed. The source and drain regions 111 serve as a lower-layer conductive region for its upper-layer wiring.

On a surface of the silicon substrate 110, a first etching stopper layer 112 and a first interlayer insulating layer 115 are formed, and a barrier metal layer 119 and a main wiring layer 120 are formed to construct dual damascene first wiring structure. The dual damascene wiring similarly serves as a lower-layer conductive region for wiring formed thereon.

In FIG. 3, lead wiring structure is formed on each of the conductive regions 111 respectively on both ends, and wiring structure is formed on the other conductive regions 111 in a central section to connect the regions to each other. That is, these MOS transistors constitute a complementary MOS (CMOS) transistor configuration.

On the first wiring layer, a second etching stopper layer 122 and a second interlayer insulating layer 125 are formed. In the stacked layers, a barrier metal layer 129 and a main wiring layer 130 are formed to construct dual damascene second wiring structure in almost the same way as for the first wiring layer.

On the second wiring layer, a third etching stopper layer 132 and a third interlayer insulating layer 135 are formed. In the stacked layers, a barrier metal layer 139 and a main wiring layer are formed to construct dual damascene third wiring structure.

On the third wiring layer, a fourth etching stopper layer 142 and a fourth interlayer insulating layer 145 are formed. In the accumulated layers, a barrier metal layer 149 and a main wiring layer 150 are formed to construct dual damascene fourth wiring structure. An arbitrary number of lower-layer dual damascene wiring structure can be configured.

By forming a multi-layer wiring configuration using dual damascene wiring structure, there can be formed wiring structure with low wiring resistance in a highly integrated configuration with low parasitic capacitance. On a surface of the lower-layer dual damascene wiring structure, a lower-etching stopper layer s1 is formed for highest-layer dual damascene wiring structure.

Although one etching stopper layer and one interlayer insulating layer are formed for each wiring layer in the description, one etching stopper layer and one interlayer insulating layer may be formed respectively for the via conductor and for the wiring pattern, which will be described later. Single damascene wiring may be used in place of the dual damascene wiring.

FIG. 1(A) shows two wiring layers w11 and w12 exposed on a surface of the underlay 10. On the upper interlayer insulating layer d2, a photo resist layer PR1 is formed and is then exposed and developed by using presence or absence of the lower-layer wiring layers w1 and w12 as an aligning marker to form a via-hole opening vo and an alignment-groove opening to. The via-hole opening vo is aligned onto the lower-layer wiring w11. The alignment-groove opening to has not any conductive-layer pattern in its lower layer.

Figure 1B:
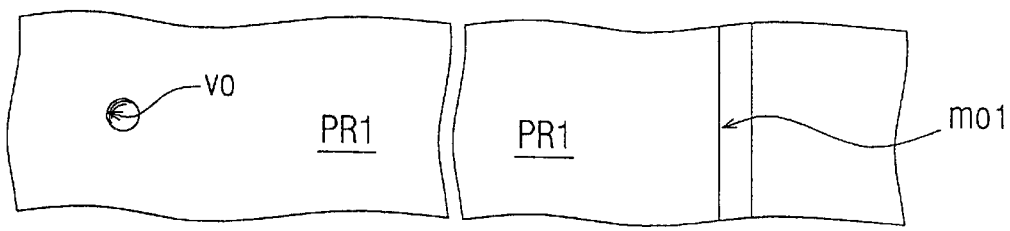

FIG. 1(B) shows a photo resist pattern in a plan view. A via-hole opening vo is an opening with a cylindrical contour. The alignment-groove opening to has a shape of an elongated groove for alignment.

Using the photo resist pattern PR1 as an etching mask, the upper interlayer insulating layer d2, the upper-layer etching stopper layer s2, and the lower interlayer insulating layer d1 are etched. The etching is automatically stopped by the stopper layer s1. The photo resist pattern PR1 is then removed by acing.

Figure 1C:
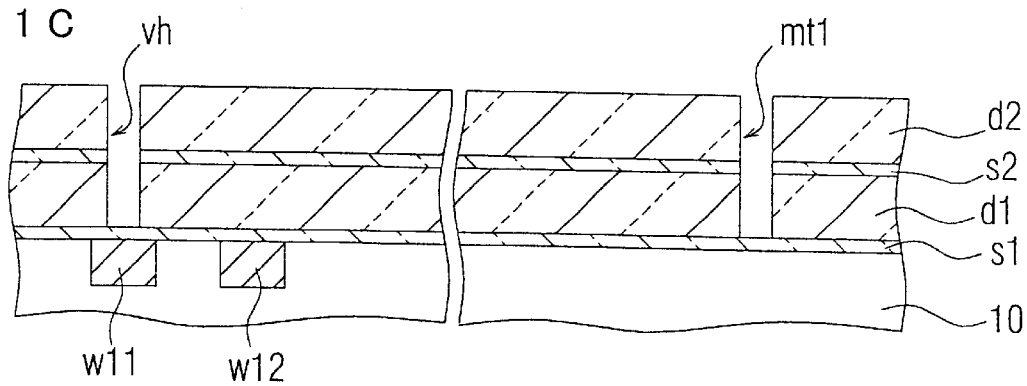

FIG. 1(C) shows a configuration of the insulating layers after etching. Using the lower-layer wiring w11 as an aligning position, a via hole vh and an aligning groove mt1 are formed up to the stopper layer s1. Although one aligning groove mt1 is shown in FIG. 1(C), it is favorable to form a plurality of aligning grooves in each of x-axis and y-axis directions (which vertically intersect each other in one two-dimensional plane).

Figure 1D:
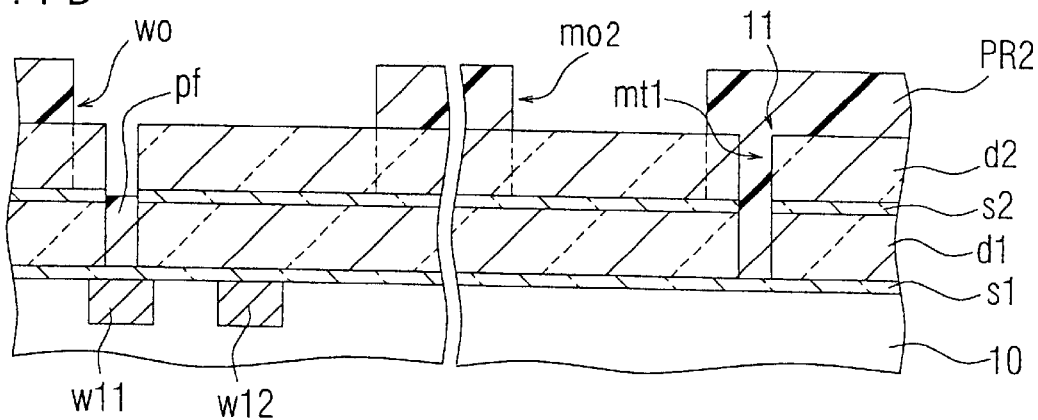

As shown in FIG. 1(D), a photo resist pattern PR2 is arranged on the upper interlayer insulating layer d2 in which the via hole vh and the aligning groove mt1 are formed as above. The photo resist pattern PR2 has a wiring-groove opening wo and an aligning-groove opening mo2. Using the aligning groove mt1 as an aligning marker, the photo resist pattern PR2 is exposed.

When the previous mask just forming before is used as a marker, the relative aligning error is within a maximum aligning error.

On the other hand, when the aligning marker formed just forming before the previous etching mask is used, it is possible to reduce a relative aligning error with respect to the subsequent etching mask. That is, in a case in which the photo resist patterns PR1 and PR2 are aligned respectively using, for example, the wiring W11 and the wiring W12, when aligning errors occur for the patterns PR1 and PR2 in a reverse direction, the relative aligning error becomes twice that taking place in the alignment of one photo resist pattern PR1 or PR2.

Therefore, to form a pattern associated with the via hole and an aligning groove which are strongly related to each other, it is favorable that the marker is constructed using the previous mask.

Figure 1E:
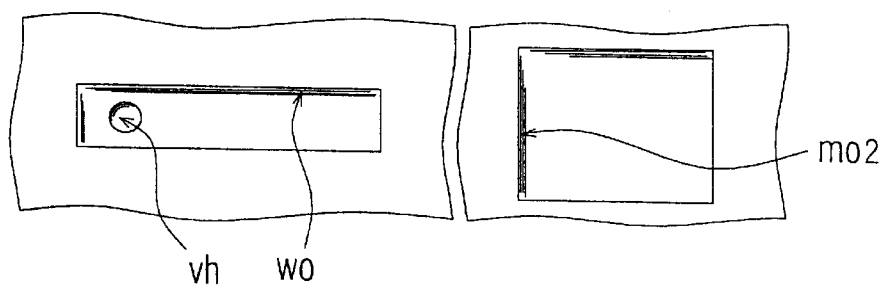

As shown in FIG. 1(E), the wiring-groove opening wo has an elongated planar space including a via hole vh. In contrast thereto, the aligning-groove opening mo2 has a wider planar space not including any via hole.

The wiring-groove hole in the circuit pattern area is narrower than the aligning-groove opening in the aligning-pattern area. For example, the wiring pattern has a width of 1.5 micrometers ($\mu$m) or less, e.g., 1.4 $\mu$m, and the aligning pattern is at least 4 $\mu$m wide, e.g., 5 $\mu$m wide.

As can be seen from FIG. 1(D), the via hole vh thus formed is then filled with a filling or plug material pf, namely, a protective organic substance prepared, for example, by removing a photosensitive material from the photo resist material. Using the photo resist pattern PR2 as an etching mask, the interlayer insulating layer d2 is etched. The etching is automatically stopped by the stopper layer s2. The photo resist pattern PR2 is removed by ashing. The protective filling material pf is also removed by ashing. A material which cannot be removed by ashing may be used as the protective filling. In this case, the protective filling material is removed by another process.

Figure 1F:
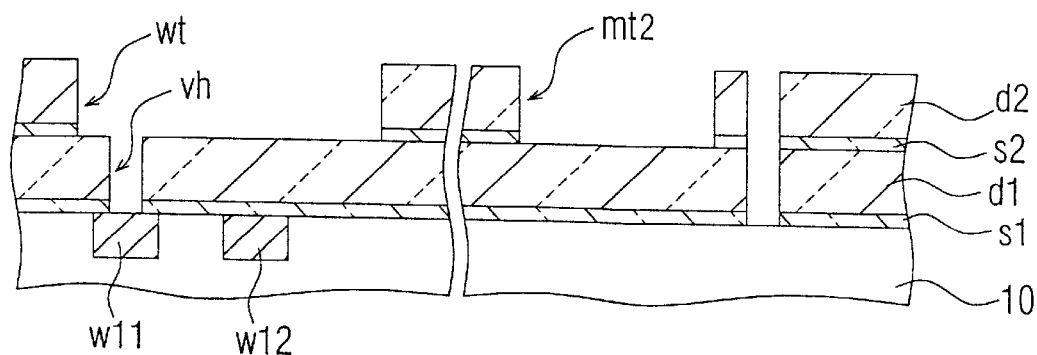

As shown in FIG. 1(F), the etching stopper layer s2 exposed in the wiring groove wt and the aligning groove mt2 and the etching stopper layer s1 exposed in the aligning groove mt1 are removed by etching. Resultantly, depressions wt and vh are formed for dual damascene structure in the circuit pattern area, and the aligning groove mt2 (mt1) is formed in the aligning pattern area.

If the underlay is not damaged by oxygen, it is also possible to successively etch the interlayer insulating layers d and the etching stoppers s to thereafter remove the photo resist pattern.

Figure 1G:
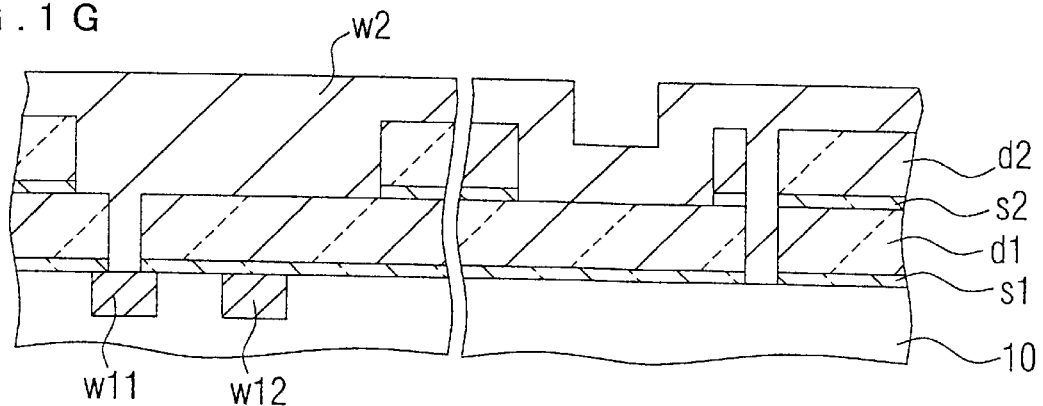

As shown in FIG. 1(G), a wiring layer w2 is isotropically formed on the insulating layer d2 in which the wiring groove wt, the via hole vh, and the aligning groove mt2 are formed. The wiring layer w2 may be laminated or may include a single layer. When the layer w2 is laminated, it is only necessary to isotropically form primary layers.

Figure 2A:
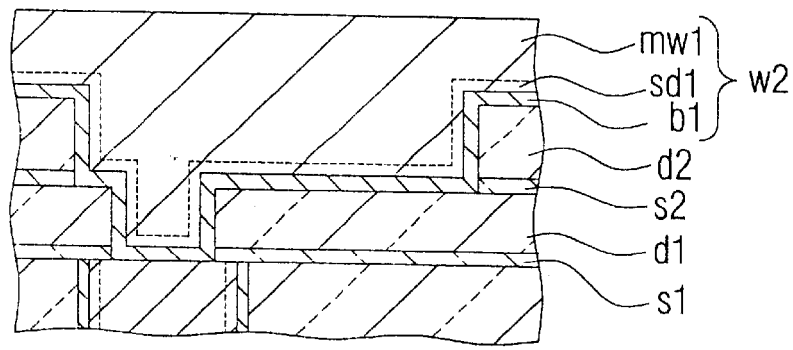
FIGS. 2(A) to 2(C) are cross-sectional views schematically showing processes of manufacturing a semiconductor device in an embodiment of the present invention.

FIG. 2(A) shows an example of laminated wiring structure, which is formed, for example, as follows. As a first barrier metal layer b1, a titanium nitride (TiN) layer having a thickness of about 50 nm is formed by sputtering, and then as a primary wiring layer mw1, an 800 nm thick copper layer is formed by plating. It is also possible that a copper seed layer sd1 is first formed by sputtering, and then the main wiring copper layer mw1 is formed by plating. When a plating process is employed, the pertinent film grows isotropically, and hence the film growth simultaneously begins at a bottom surface and at side surfaces. Chemical vapor deposition (CVD) may be used to form the isotropic wiring layer.

Since the opening in the circuit pattern area has a width of, for example, about 1.4 $\mu$m, when the wiring layer piled on each of the side surfaces becomes 700 nm thick or more, the opening is completely filled with the material thus piled. In the circuit pattern area, the wiring layer has therefore substantially a flat surface.

Since the aligning groove in the aligning pattern area is about 5 $\mu$m wide, even when a first primary wiring layer mw1 is formed to have a width of about 800 nm, a step still remains in the opening. This step can be used as an aligning marker in a subsequent process.

Figure 1H:
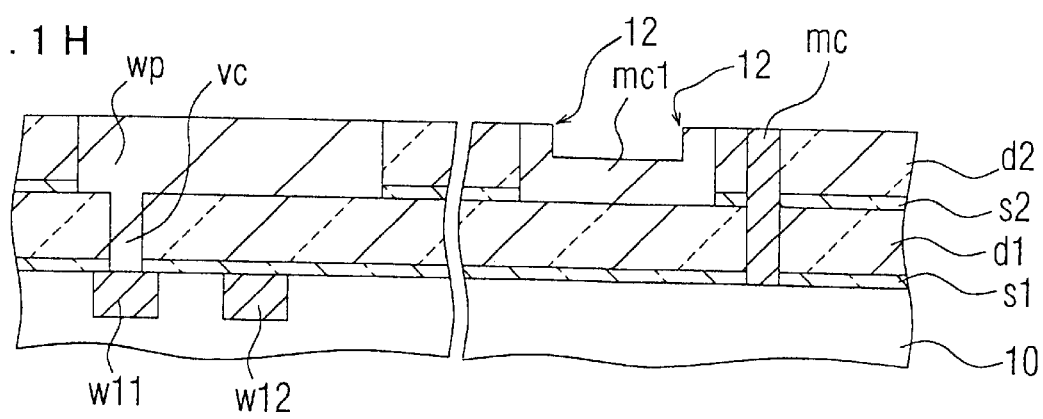

As shown in FIG. 1(H), the wiring layer w2 piled on the insulating layer d2 is removed by chemical and mechanical polishing. In the circuit pattern area, a wiring pattern wp and a via conductor vc are formed in the wiring groove and the via hole. Resultantly, the circuit pattern area has a surface substantially in a plane in which the surface of the insulating layer d2 exists.

In the aligning pattern area, the wiring layer w2 on the insulating layer d2 is removed, and a step remains in a conductor pattern mc1 in the aligning groove. A shoulder section of the step is copied onto an upper layer to serve as an aligning marker. Description will now be given of conditions to provide a step after the CMP.

Figure 4A:
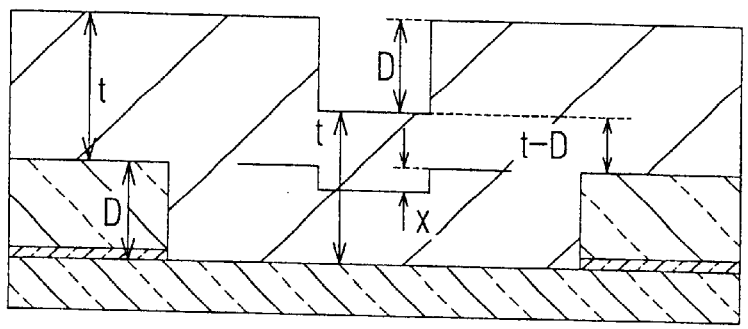
FIGS. 4(A) and 4(B) are respectively a cross-sectional view and a graph schematically showing conditions to form a step for an aligning marker.

FIG. 4(A) shows various sizes of the wiring layer before CMP in a schematic cross-sectional view. Assume that the total thickness of the insulating layer d2 and the stopper layer s2 is D. The wiring layer w2 piled thereon has a thickness of t. Assume that the wiring layer is formed with a uniform thickness of t. In this layer, a depression having a depth of D is formed in the groove section to be used as an aligning marker.

Chemical and mechanical polishing is conducted on the surface of the wiring layer by CMP. However, in the depression, the mechanical polishing is not conducted, but only the chemical etching is conducted. Assume that the chemical and mechanical polishing has an etching rate of r and only the chemical etching has an etching rate of e=r×c. When a thickness of t is chemically and mechanically polished beginning at the upper-most surface of the wiring layer, a depth of tc is chemically etched on the bottom surface of the depression.

Therefore, when the chemical etching rate is, for example, ½ (or ⅓) of the chemical and mechanical etching rate (and a thickness of t is etched by the chemical and mechanical etching), the bottom surface of the depression is etched downwards t/2 (or t/3). When the remaining wiring layer in the bottom of the depression has a thickness of D or less, the step remains also after CMP.

Figure 4B:
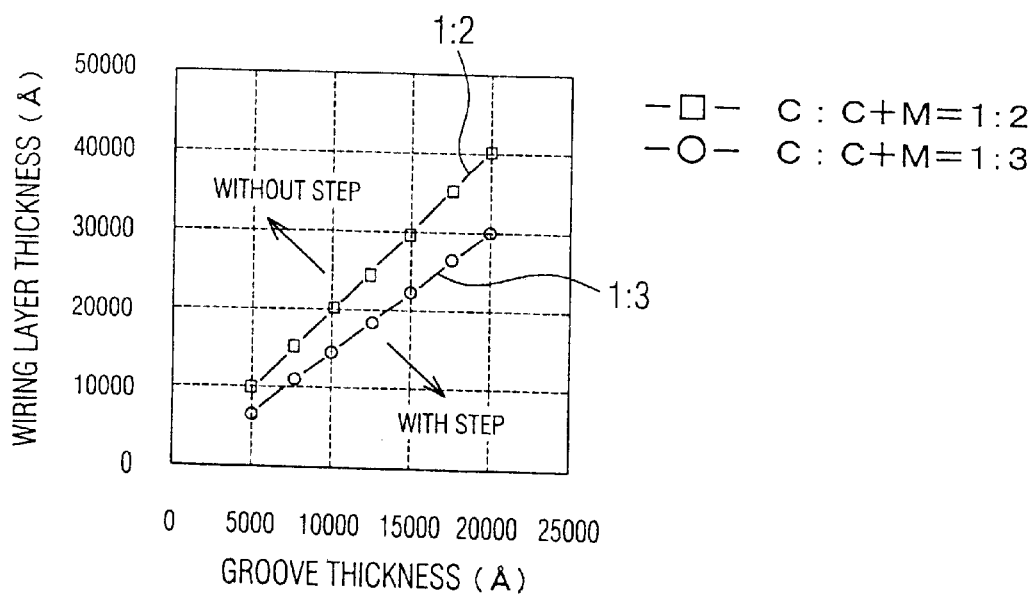

FIG. 4(B) is a graph showing a layer in which a step remains after CMP and a layer in which a step does not remain after CMP when the chemical etching rate is ⅓ and ½ of the chemical and mechanical etching rate. The abscissa of the graph indicates the depth of groove formed before the wiring layer is piled, the depth being represented in angstrom (Å). The ordinate indicates the thickness of the wiring layer piled on the step. When the size of the marker groove formed in the aligning pattern area and the thickness of the wiring layer piled thereon are appropriately selected according to the graph of FIG. (B), the step remains after CMP. The step can serve as an aligning marker in a subsequent process.

As above, in the process to form the damascene wiring, the aligning marker can be simultaneously formed.

Figure 1I:
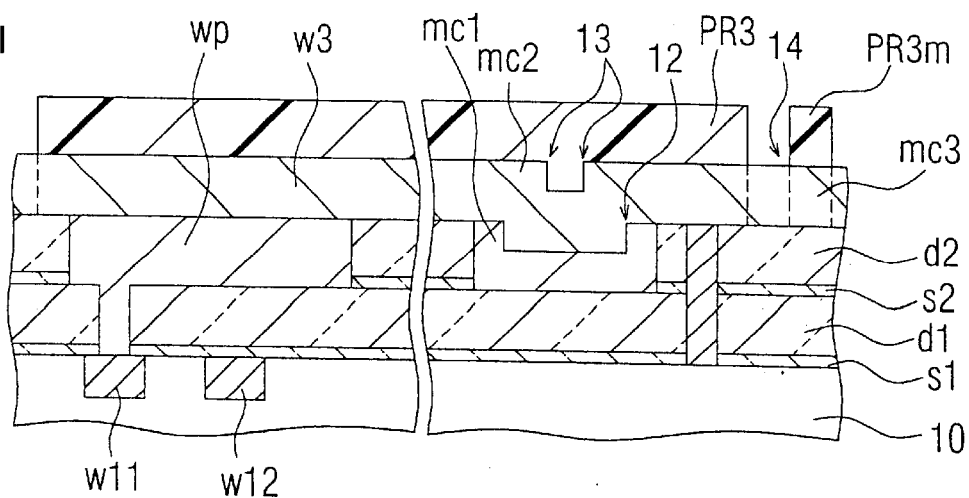

As shown in FIG. 1(I), on a surface of the insulating layer d2 with the damascene wiring thus formed, a surface wiring layer w3 is anisotropically or isotropically formed. When anisotropical deposition is used, the step is reflected upward. When isotropic deposition is used, the size of the depression and the thickness of the piled layer must be appropriately selected so that the step is kept remained. Even in the anisotropic deposition, when there exists a chance of reduction of the step, the size of the depression and the piling condition must be selected so that the step is kept remained, namely, so that the step is sufficiently recognized. As a result, there are formed shoulder sections 13 by copying shoulder sections 12 of the lower layer. Each shoulder section 13 or a central position between the shoulder sections 13 can be used as an aligning marker.

The surface wiring layer w3 includes a primary wiring layer made of aluminum (including an aluminum alloy) to form, for example, a bonding pad.

Figure 2B:
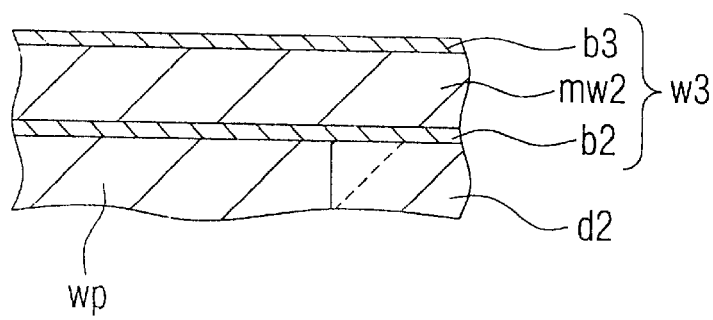

FIG. 2(B) shows an example of constitution of the surface wiring layer. The surface wiring layer includes, for example, an about 50 nm thick titanium nitride (TiN) layer as a lower barrier metal layer b2, an about 800 nm aluminum layer as a primary wiring layer mw2, and an about 50 nm titanium nitride layer as an upper barrier metal layer b3. Each of the layers is formed, for example, by sputtering.

The lower barrier metal layer b2 has a function to prevent solid-phase diffusion of copper of the damascene wiring and aluminum of the main wiring formed thereon. Formed on a surface of the upper barrier metal layer b3 is a step reflecting the depression and the projection of the underlay.

In FIG. 1(I), the wiring layer w3 is coated with a photo resist layer. The photo resist layer is exposed and is then developed to form a resist pattern PR3, which is used to form a surface wiring pattern. The resist pattern PR3 includes a new aligning-marker pattern PR3m and the surface wiring pattern.

In the process to form the resist pattern, a shoulder section 13 of the step formed in the surface of the wiring layer w3 is used as an aligning maker. By using the step in this way, the aligning can be conducted for the metallic layer of which the overall surface has a high reflection factor.

The wiring layer w3 is etched using the resist pattern PR3 as an etching mask. In the circuit pattern area, a surface wiring pattern is formed such that the damascene wiring pattern wp is covered with the surface wiring pattern. In the aligning pattern area, there are formed a new aligning surface wiring pattern mc3 and a surface wiring pattern mc2 such that the aligning wiring pattern mc1 is covered with the pattern mc2.

The aligning pattern mc3 has a flat surface and its shoulder section 14 can be used as an aligning marker in a subsequent process. When the pattern mc2 can be used as an aligning marker, the pattern mc3 may be dispensed with.

The surface wiring patterns wt and mc2 are favorably formed in contours such that upper surfaces respectively of the wiring pattern wp and the aligning wiring pattern mc1 formed with the damascene wiring. When the damascene wiring includes a main wiring layer made of copper, a surface of the copper layer is completely covered with the surface wiring (specifically, with the lower barrier metal layer). Therefore, in subsequent processes, the copper layer is protected against, for example, corrosion.

Figure 1J:
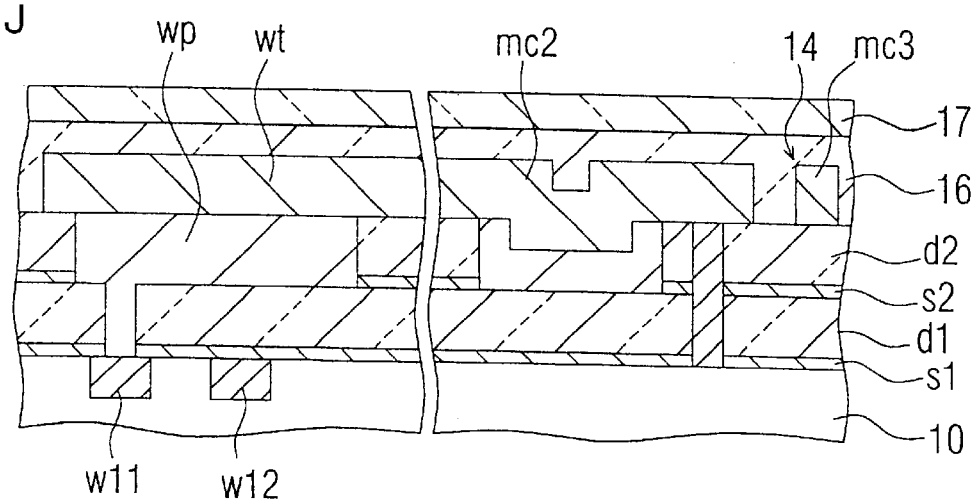

As shown in FIG. 1(J), on a surface of the insulating layer d2 with the surface wiring layer formed as above, a silicon dioxide ($SiO_2$) layer with a thickness of, for example, about 400 nm is formed as a lower protective insulating layer 16. Formed on the layer 16 is a silicon nitride (SiN) layer with a thickness of, for example, about 300 nm as an upper protective insulating layer 17.

Figure 1K:
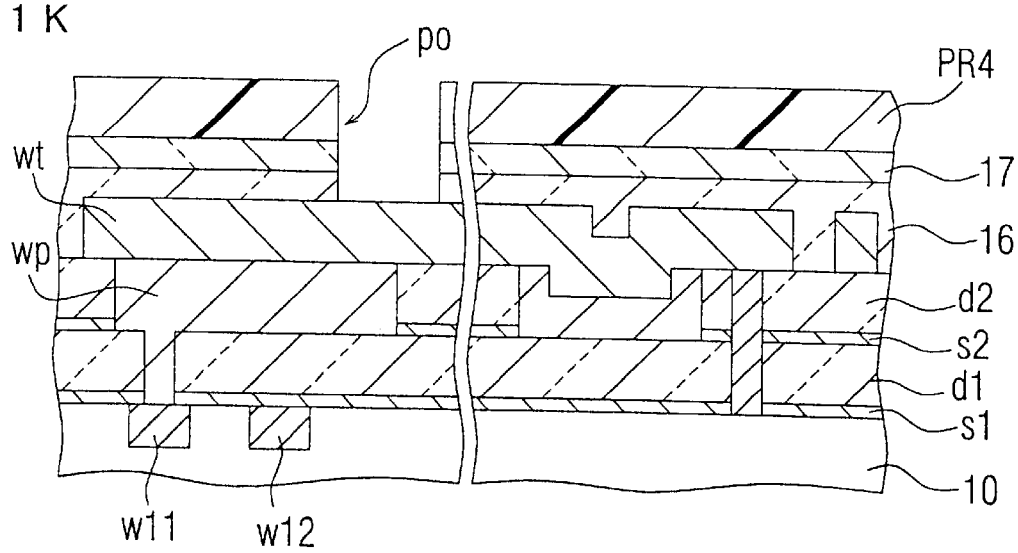

As can be seen from FIG. 1(K), a photo resist layer PR4 is formed on the upper protective insulating layer 17. By exposing and developing the photo resist layer PR4, an opening po is formed in an area in which, for example, a pad is to be formed. In the process of lithography, the aligning surface wiring patterns mc3 or mc2 is used as an aligning marker.

Using the resist pattern PR4 with the opening po as an etching mask, the protective insulating layers 17 and 16 below the resist pattern PR4 are etched to expose the surface wiring layer wt.

Figure 2C:
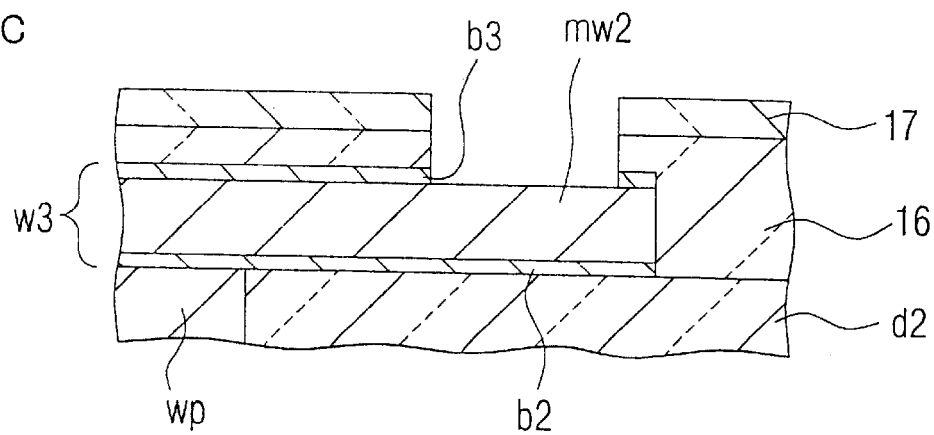

When the wiring layer w3 is a lamination including a lower barrier metal layer b2, an aluminum wiring layer mw2, and an upper barrier metal layer b3, the upper barrier metal layer b3 is etched in the opening as shown in FIG. 2(C) to expose a surface of the aluminum main wiring layer mw2. This resultantly forms a bonding pad having an aluminum surface.

Using the same lamination structure, it is possible to form a wiring layer and a fuse. When forming a fuse, the lower and upper interlayer insulating layers need not be necessarily removed.

Figure 5:
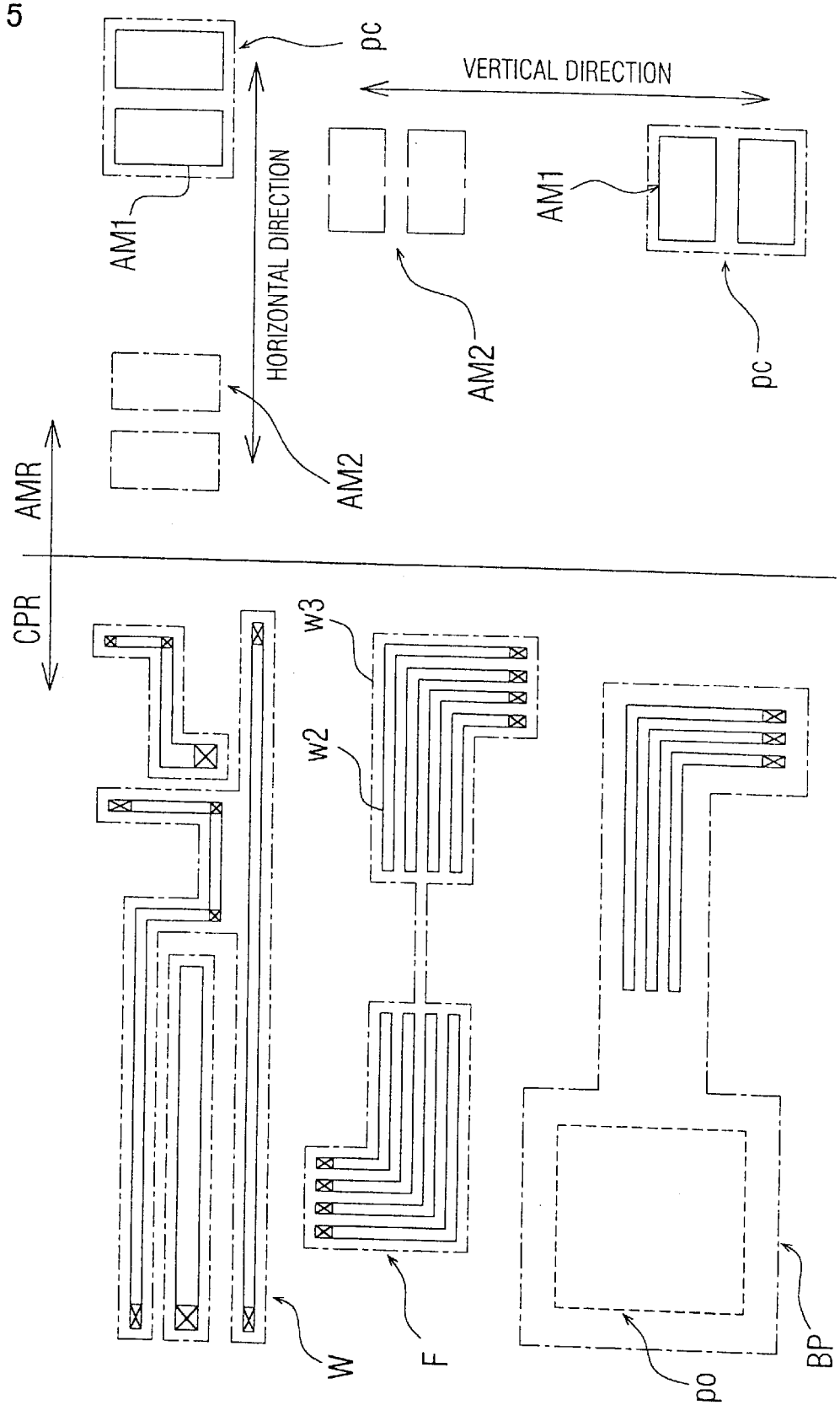
FIG. 5 is a plan view showing upper-surface structure of a semiconductor device in an embodiment of the present invention.

FIG. 5 schematically shows configuration of wiring, a fuse, and a bonding pad formed using the highest wiring layer. An area indicated by solid lines is a damascene wiring pattern w2 (wp, mc1) formed using, for example, a copper layer mw1 and a titanium nitride (TiN) layer b1. An area indicated by a dot-and-dash line is a surface wiring layer w3 formed using, for example, a lower barrier metal layer b2, a main wiring layer mw2, and an upper barrier metal layer b3.

The surface wiring layer w3 is used to configure wiring W, a fuse F, a bonding pad BP, and an aligning marker AM2. In the bonding pad BP, an opening po disposed by removing an insulating thereon actually serves as an effective bonding pad area. The fuse F includes a central area of only a surface wiring and a lamination area of a damascene wiring layer and a surface wiring layer on both sides of the central area. By disconnecting the central surface wiring by an electric current, a laser beam, or the like, the side sections are electrically disconnected from each other. In the wiring area W, the surface wiring is overlapped with the damascene wiring to reduce resistance. Shown in an upper-right corner of the diagram is a protective cover layer which covers an aligning marker AM1 formed using a copper layer and a titanium nitride (TiN) layer to protect copper.

In the wiring structure, a bonding pad and a fuse can be formed using aluminum on the damascene wiring using copper. Resistance of the wiring structure can be reduced by the subordinate wiring.

When the damascene wiring is formed, the step for the aligning marker is simultaneously formed. When the surface wiring is formed, the aligning surface wiring pattern is simultaneously formed. Therefore, without increasing the number of masks and processes, the aligning can be conducted for a resist pattern formed on a layer.

Description has been given of structure for the dual damascene wiring. A similar aligning marker can be used also for the single damascene wiring.

Figure 6A:
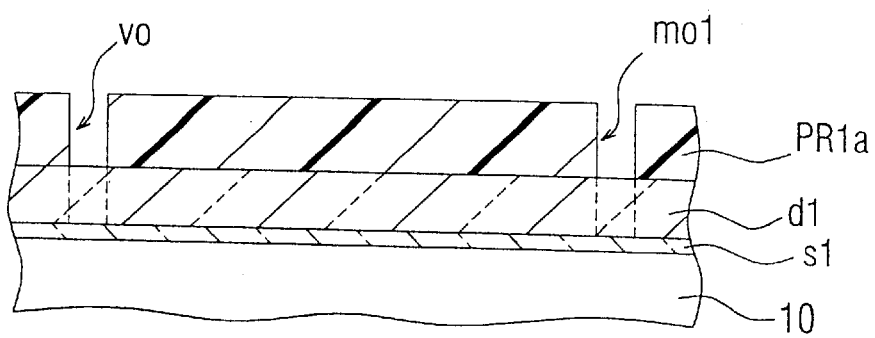
FIGS. 6(A) to 6(D) are cross-sectional views showing processes of manufacturing a semiconductor device in another embodiment of the present invention.

As shown in FIG. 6(A), an etching stopper layer s1 and a lower interlayer insulating layer d1 are formed on the underlay 10. A photo resist layer is formed on the insulating layer d1. Using the wiring in the lower layer as an aligning marker, there is formed a resist pattern PR1a having a via-hole opening vo and an aligning-groove opening mo1. The resist pattern PR1a has a planar contour like the resist pattern PR1 shown in FIG. 1(B).

The insulating layer d1 is etched using the photo resist pattern PR1a as an etching mask. The photo resist pattern PR1a is then removed by ashing. Thereafter, the etching stopper layer s1 is removed by etching.

Figure 6B:
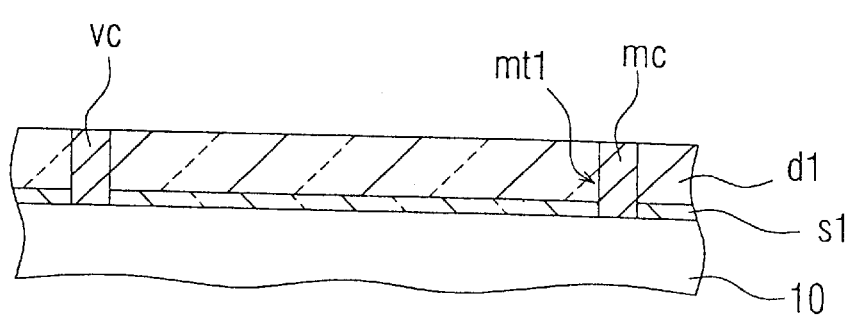

As shown in FIG. 6(B), a titanium nitride (TiN) barrier layer and a main wiring layer of copper are formed. Unnecessary sections of the wiring layer on the insulating layer d1 are then removed by CMP such that a via conductor vc and an aligning groove conductor mc remain as a result.

Figure 6C:
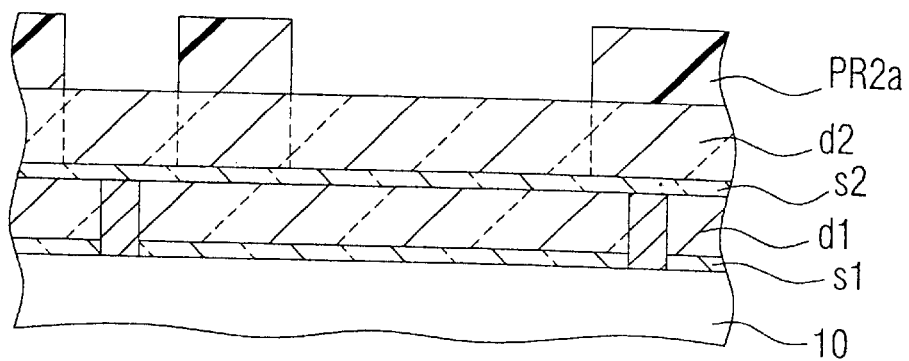

On the insulating layer d1, an upper etching stopper layer s2 and an upper interlayer insulating layer d2 are formed as shown in FIG. 6(C). A photo resist layer is formed thereon. Using the aligning-groove conductor mc (FIG. 6(B)) as an aligning marker, the photo resist layer is exposed and is developed to obtain a photo resist pattern PR2a. The resist pattern PR2a has a planar contour like the resist pattern PR2 shown in FIG. 1(E).

The insulating layer d2 is etched using the photo resist pattern PR2a as an etching mask. The photo resist pattern PR2a is then removed by ashing, and the etching stopper layer s2 is then removed by etching.

Figure 6D:
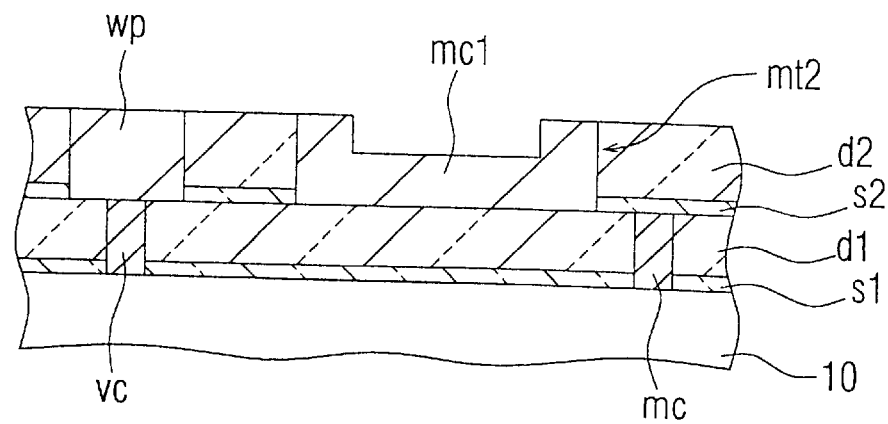

As shown in FIG. 6(D), a titanium nitride (TiN) barrier layer and a copper layer are formed. Unnecessary sections of the layer on the insulating layer d2 are then removed by CMP. As a result, a single damascene wiring pattern wp including the via conductor vc and a wiring pattern wp is formed in the circuit pattern area, and an aligning wiring pattern mc1 having a step is formed in the aligning pattern area. Processes after this point are similar to those shown in FIG. 1(I) to FIG. 1(K).

The present invention has been described according to the embodiment. However, the present invention is not restricted by those embodiments.

The wiring layers are formed using copper, titanium nitride (TiN), and aluminum. However, the wiring layer can be formed using metals such as gold, silver, copper, tungsten, aluminum, titanium, tantalum, molybdenum, and zirconium; alloys of metals such as an alloy of aluminum and an alloy of copper; and compounds of metals such as titanium nitride, tungsten nitride, tantalum nitride, and molybdenum nitride. The main wiring layer is favorably formed using gold, silver, copper, tungsten, or aluminum (including aluminum alloys).

The barrier metal layer can be formed using titanium, tantalum, molybdenum, titanium nitride, tantalum nitride, tungsten nitride, molybdenum nitride, and the like.

For the insulating layer, there can be used, for example, oxide of silicon, oxide of silicon with fluorine as additive, silicon oxynitride, nitrides of silicon, silicon oxycarbide, inorganic compounds, organic compounds, and porous compounds. When an etching stopper layer and an interlayer insulating layer are used, the etching stopper layer can be formed using silicon nitride, silicon carbide, silicon oxynitride, and the like.

Although description has been given of an semiconductor integrated circuit device using copper wiring for high-speed operation, the dual damascene wiring is also effective to form high-density aluminum wiring. When the required operation speed can be lowered, the restrictions imposed on the wiring materials and interlayer insulating layer materials are mitigated and hence the number of available materials is increased.

For example, the interlayer insulating layer may be selected from the following layers, that is, a layer of oxide of silicon, a film of oxide of silicon with additives such as fluorine, phosphorus, and/or boron; layers of silicon oxide formed using different initial or seed materials such as hydrogen silsesquioxane (HSQ) and tetra-ethoxy silicate (TEOS); a layer of nitride of silicon, a layer of silicon oxynitride, a layer of inorganic compound having siloxane bonding, and a layer of organic compound having siloxane bond. For the etching stopper layer, it is possible to use a layer of nitride of silicon, a layer of silicon oxynitride, or a layer of silicon carbide (SiC, SiC:H).

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor device manufacturing method, comprising the steps of:
   (a) forming a second insulating layer above an underlay including a semiconductor substrate including a plurality of semiconductor elements;
   (b) forming a wiring groove having a first width and an aligning groove having a second width in a surface of said second insulating layer beginning at said surface said second width being larger than said first width;
   (c) forming second damascene wiring embedded in said wiring groove, said second damascene wiring having substantially a flat surface and forming a wiring pattern in said aligning groove, said wiring pattern having a first step;
   (d) forming a surface wiring layer on said second insulating layer, covering said second damascene wiring and said wiring pattern, said surface wiring layer forming a second step reflecting the first step of said wiring pattern;
   (e) forming a resist layer on said surface wiring layer, exposing and developing said resist layer using said second step as an aligning marker, and resultantly forming a resist pattern; and
   (f) etching said surface wiring layer using said resist pattern as an etching mask and resultantly forming a surface wiring pattern connected to said second damascene wiring.

2. A semiconductor device manufacturing method according to, claim 1, wherein said step (c) comprises the steps of:
   isotropically depositing piling a wiring layer having a thickness larger than one half of said first width and smaller than one half of said second width; and
   removing said wiring layer on said second insulating layer by chemical and mechanical polishing.

3. A semiconductor device manufacturing method according to claim 1, wherein
   said step (f) further forms an aligning surface wiring pattern, said method further comprising the steps of:
   (g) forming a third insulating layer on said second insulating layer, said surface wiring pattern being covered with said third insulating layer;
   (h) removing said third insulating layer partly in an area of said surface wiring pattern using said aligning surface wiring pattern as an aligning marker;
   (x) forming in said underlay, before said step (a), a first insulating layer in which first damascene wiring is embedded, said wiring groove having a via hole in a bottom thereof, said via hole reaching said first damascene wiring.

4. A semiconductor device manufacturing method according to claim 3, wherein:
   said step (d) comprises the step of forming a surface wiring layer including a lamination including a main wiring layer and an upper-side barrier metal layer thereon; and said step (h) comprises the step of removing said upper-side barrier metal layer.

5. A semiconductor device manufacturing method according to claim 1, wherein said step (b) comprises the steps of:
   forming a lower interlayer insulating layer having a via hole;
   forming a via conductor in said via hole; and
   forming an upper interlayer insulating layer on said lower interlayer insulating layer, said upper interlayer insulating layer having a wiring groove.

6. A semiconductor device manufacturing method according to claim 1, wherein said step (b) comprises the steps of:
   forming a via hole and an aligning groove in said second insulating layer;
   forming a resist layer on said second insulating layer; and
   forming openings for forming a wiring groove and an aligning groove in said resist layer, using said aligning groove as an aligning marker.

* * * * *